US007666007B2

(12) United States Patent
Hsu et al.

(10) Patent No.: US 7,666,007 B2
(45) Date of Patent: Feb. 23, 2010

(54) ELECTRONIC INTERCONNECTING SYSTEM FOR COMPUTER

(75) Inventors: Ching-Chung Hsu, Tu-Cheng (TW); Chung-Chin Chiu, Tu-Cheng (TW); Min-Lun Ma, Tu-Cheng (TW); Xiao-Li Li, Kunshan (CN)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/072,169

(22) Filed: Feb. 25, 2008

(65) Prior Publication Data

US 2008/0207021 A1    Aug. 28, 2008

(30) Foreign Application Priority Data

Feb. 26, 2007    (TW) .............................. 96106465 A

(51) Int. Cl.
*H01R 12/00*    (2006.01)
(52) U.S. Cl. .................... 439/79; 439/638; 439/502; 235/492
(58) Field of Classification Search .................. 439/79, 439/638, 502; 235/492
See application file for complete search history.

(56) References Cited

U.S. PATENT DOCUMENTS 6,626,703 B2 *   9/2003   Hsin .......................... 439/638
6,746,273 B1 *   6/2004   Liu et al. ..................... 439/502
7,229,310 B1 *   6/2007   Brown et al. ................. 439/440
7,367,513 B2 *   5/2008   Andrus ....................... 235/492
7,394,661 B2 *   7/2008   Wang et al. .................. 361/737

FOREIGN PATENT DOCUMENTS

TW          M250401          11/2004

OTHER PUBLICATIONS

"PL-25A1 High Speed USB Host-to-Host Bridge Controller Product Datasheet" published on May 10, 2006 by Prolific Technology Inc.

* cited by examiner

*Primary Examiner*—Truc T Nguyen
(74) *Attorney, Agent, or Firm*—Wei Te Chung; Andrew C. Cheng; Ming Chieh Chang

(57) ABSTRACT

A cable connector assembly adapted for interconnecting two computers includes a first cable connector assembly (100) and a second cable connector assembly. The first cable connector assembly (100) includes a universal serial bus (USB) migration control block (2) having a printed circuit board (21) with a USB migration control chipset (U2) mounted thereon, a first universal serial bus connector (1) soldered to a first end of the printed circuit board and a cable (5) with one end soldered to a second end of the printed circuit board. The second cable connector assembly includes a second universal serial bus connector electrically connecting with the other end of the cable.

9 Claims, 7 Drawing Sheets

ELECTRONIC INTERCONNECTING SYSTEM FOR COMPUTER

BACKGROUND OF THE INVENTION

1. Field of the Invention

The present invention generally relates to an electronic interconnecting system, and more particularly to a cable connector assembly adapted for signal transmission between two computers.

2. Description of Related Art

As it known to us, a computer generally includes some hardware and software. The hardware is mainly made up of central process unit (CPU), motherboard (MB), Hard Disk (HD), display card, sound card and so on. Further, the computer also has some input/output (I/O) ports, such as USB ports, Audio ports etc. The computer and other electronic devices can exchange data between those ports and other corresponding ports of electronic devices via some cable connector assemblies. While the software consists of operating system and some drivers. At present, Windows XP is widely used as the computer operating system, and Windows Vista, a latest edition of the operating system, has been gradually accepted. These operating system and drivers should be installed on the computer and properly set.

Whereas, for most users, they may already have an old computer, and a lot of useful data has been stored on the computer, when they buying a new computer, they need to reset the computer, and it may take a long time to do such work. What's more, how to transfer the data of the old computer to the new computer is much difficult for most users. However, as a new edition of the operating system, Windows Vista is issued and a cable connector assembly Windows Easy Transfer is used, the aforementioned problem will be solved. The BAFO Inc. has produced a type of cable connector assembly BF-7313 which can transfer the data or settings of a computer configured with Windows XP system to another computer with Windows Vista operating system, and two computers both installed Windows Vista can exchange data with each other too. The BF-7313 is made up of a pair of Universal Serial Bus (USB) connectors, a cable, and a USB migration control block arranged between the separate USB connectors and connecting with them by the cable. The USB migration control block is used for controlling data transmission by the USB connectors. The USB migration control block includes a print circuit board (PCB), a chipset for controlling data transmitting, two oscillators, storage, number of other electronic elements, such as resistors, capacitors, inductances mounted on the PCB.

However, the cable connector assembly aforementioned has two USB connectors both need to connecting with the cable, which makes it more difficult in manufacturing such product and increasing expense of making the product.

Hence, an improved cable connector assembly is highly desired to overcome the disadvantages of the related art.

SUMMARY OF THE INVENTION

Accordingly, an object of the present invention is to provide a low cost cable connector assembly which is easily manufactured and of low cost.

In order to achieve the object set forth, a cable connector assembly adapted for interconnecting two computers comprises a first cable connector assembly and a second cable connector assembly. The first cable connector assembly comprises a universal serial bus (USB) migration control block having a printed circuit board (PCB) with a USB migration control chipset mounted thereon, a first universal serial bus connector soldered to a first end of the printed circuit board and a cable with one end soldered to a second end of the printed circuit board. The second cable connector assembly includes a second universal serial bus connector electrically connecting with other end of the cable.

Other objects, advantages and novel features of the invention will become more apparent from the following detailed description when taken in conjunction with the accompanying drawings.

DETAILED DESCRIPTION OF THE INVENTION

Reference will now be made in detail to the preferred embodiment of the present invention.

Figure 1:
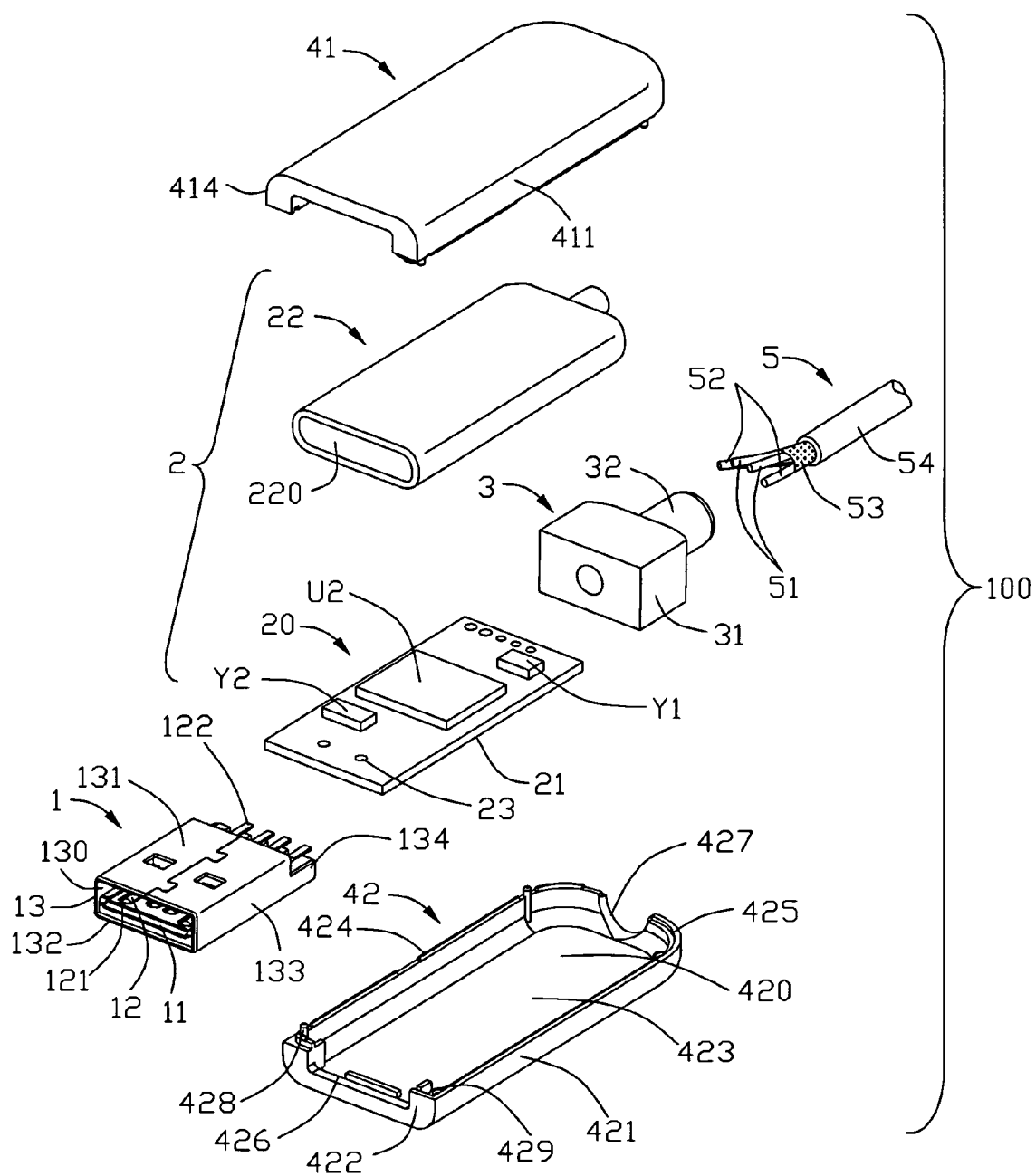
FIG. 1 is a partially exploded, perspective view of a cable connector assembly in accordance with the present invention.
Figure 2:
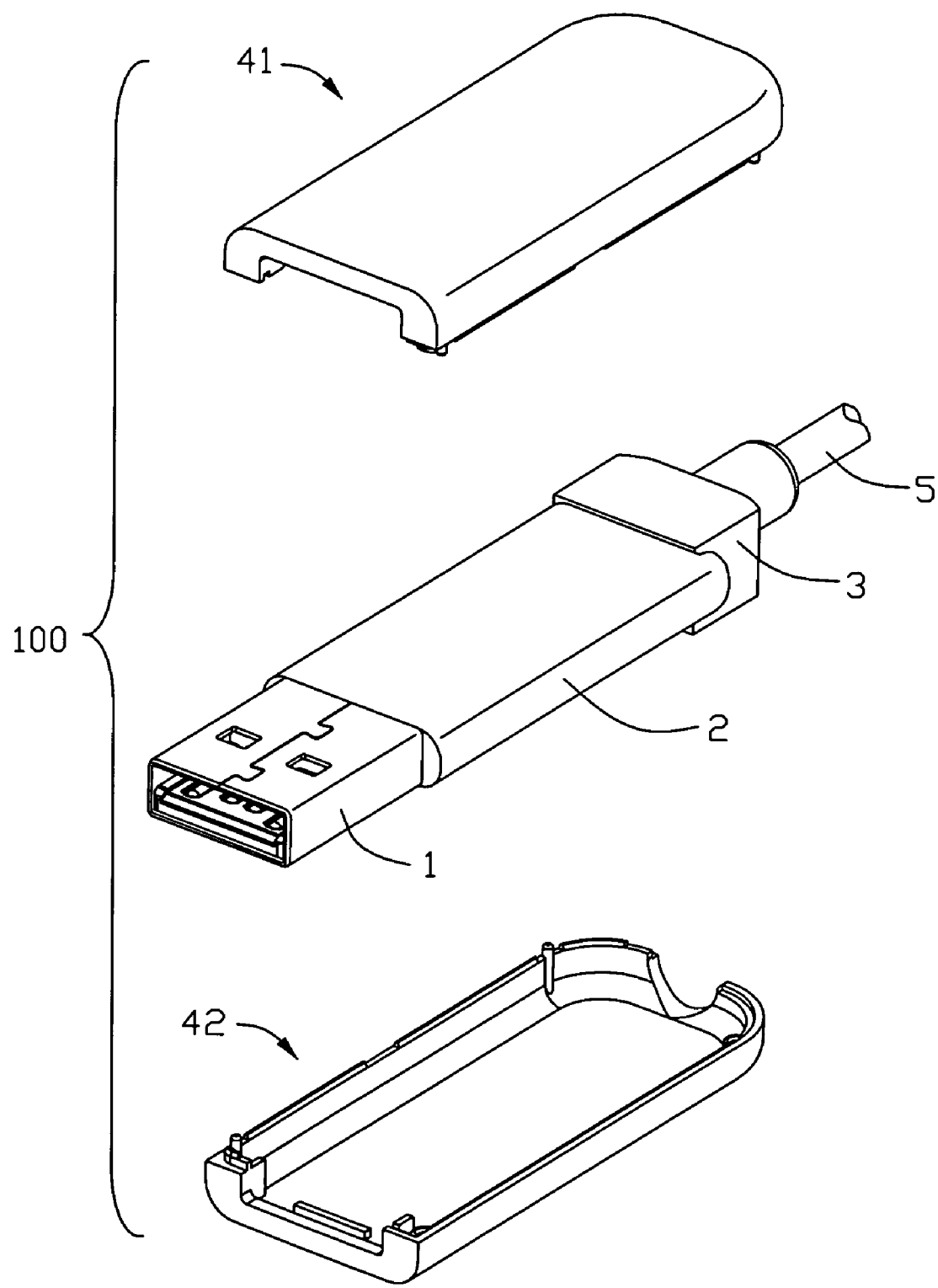
FIG. 2 is a partially assembled, perspective view of FIG. 1.
Figure 3:
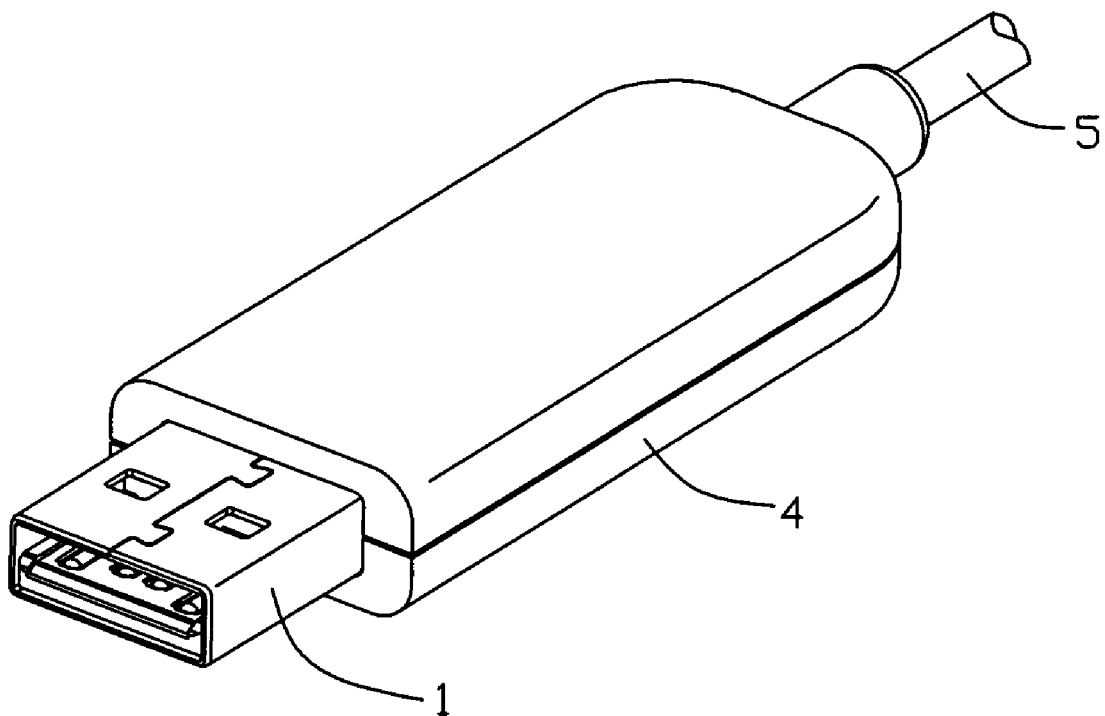
FIG. 3 is an assembled, perspective view of FIG. 1.

Referring to FIGS. 1-3, an electronic interconnecting system in accordance with the present invention comprises a first cable connector assembly 100 connecting with a second cable connector assembly (not shown). The first cable connector assembly 100 comprises a universal serial bus (USB) migration control block 2, a first USB connector 1 electrically connecting with a front end of the USB migration control block 2, a cable 5 electrically connecting with an opposite rear end of the USB migration control block 2, a strain relief device 3 molded over a conjunction between the USB migration control block 2 and the cable 5, and a cover 4 enclosing the USB migration control block 2. The second cable connector assembly (not shown) comprises a second USB connector electrically connecting an opposite end of the cable 5. The first USB connector 1 is couples to corresponding USB port of a first computer (not shown), while the second USB connector is adapted for mating with corresponding USB port of the second computer (not shown). Thus, the first cable connector assembly 100, a second cable connector assembly and the first and the second computers constitute a computer interconnecting system to transmit data from the first computer to the second computer or from the second computer to the first computer.

The first USB connector 1 and the second USB connector have a similar structure, each comprises an insulated housing 11, a number of terminals 12 received in the insulated housing 11 and a metal shell 13 shielding the insulated housing 11. The shell 13 comprises a top wall 131, an opposite bottom wall 132 and a pair of side walls 133 interconnecting with the top and the bottom walls 131, 132 to form a hollow 130 for accommodating the insulated housing 11. The rear portion of the insulated housing 11 further forms two vertical posts (not shown) for penetrating into a pair of holes 23 of the front end of a printed circuit board 21 to enhance the mechanical connection between the first USB connector 1 and the USB migration control block 2. The terminals 12 comprise a pair of middle signal terminals and two grounding terminals separately disposed outside of the middle signal terminals, with forward ends located closer to the front surface of the insulated housing 11 than those of the pair of the signal terminals. Each terminal 12 comprises a contacting portion 121 and an opposite rear portion 122. The contacting portion 121 of the terminal 12 partially exposes in the front part of the hollow 130, while the rear portion 122 of the terminal 12 rearwardly extends beyond the hollow 130. A pair of protrusions 134 respectively extend rearward from the pair of side walls 133 of the metal shell 13.

The cable 5 comprises a pair of signal wires 51 and the other pair of power wires 52, a metal braiding shield 53 enclosing the signal wires 51 and power wires 52, and an insulated jacket 54 shrouding the metal braiding shield 53. The strain relief device 3 comprises a rectangular cross-section base portion 31 and a cylindrical-shape protruding portion 32 extending rearward from the back of the base portion 31.

The cover 4 is made of plastic material, such as polyester or resin. The cover 4 includes an upper half part 41 and a lower half part 42 together define a receiving space (not labeled) therebetween. The lower half part 42 comprises a bottom wall 423, a pair of left and right walls 424, 421 respectively extending upright from side edges of the bottom wall 423, a front wall 422 and a back wall 425 respectively extending upwardly from the forward edge and an opposite rear edge of the bottom wall 423 to cooperatively form a chamber 420. The front wall 422 defines a rectangular opening 426, while the back wall 425 has a semi-circular hole 427 thereon. The left wall 424 forms a pair of positioning post 428 spaced arranged thereon, while the right wall 421 defines a pair of retaining holes 429 apart from each other. The upper half part 41 is similar to the lower half part 42, except for corresponding retaining holes (not shown) defined on a left wall 414 and positioning posts (not labeled) formed on a right wall 411. Thus, the lower half part 42 and the upper half part 41 are aligned with each other more accurately via engagement between the positioning posts of the upper half part 41 and the retaining holes 429 of the lower half part 42, and the retaining holes of the upper half part 41 and the positioning posts 428 of the lower half part 42.

The USB migration control block 2 comprises an insulated member 22 defining a longitudinal roomage 220 and a USB migration control unit 20 accommodated in the roomage 220. The USB migration control unit 20 consists of a printed circuit board (PCB) 21 and numbers of electronic elements arranged thereon.

Figure 4:
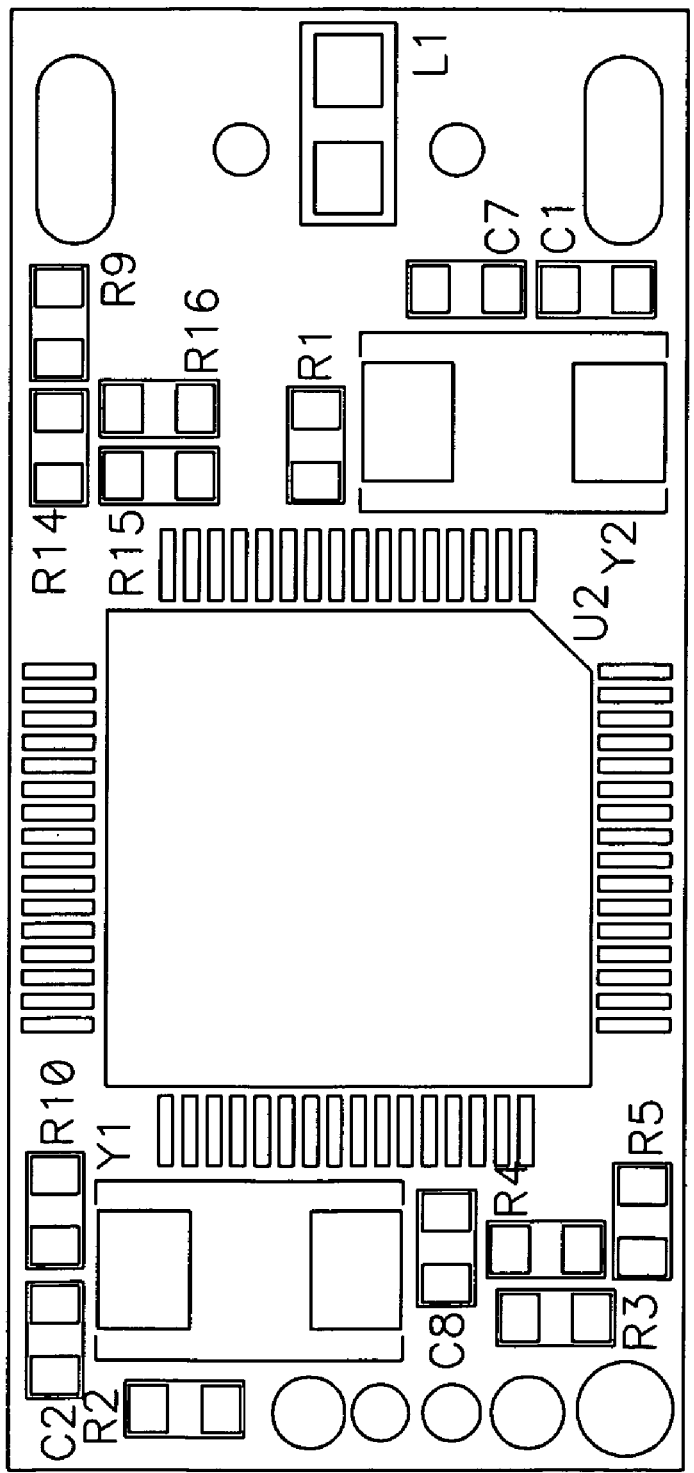
FIG. 4 is a sketch view of electronic elements disposed on an upper surface of a printed circuit board (PCB) of a universal serial bus (USB) migration control block.
Figure 5:
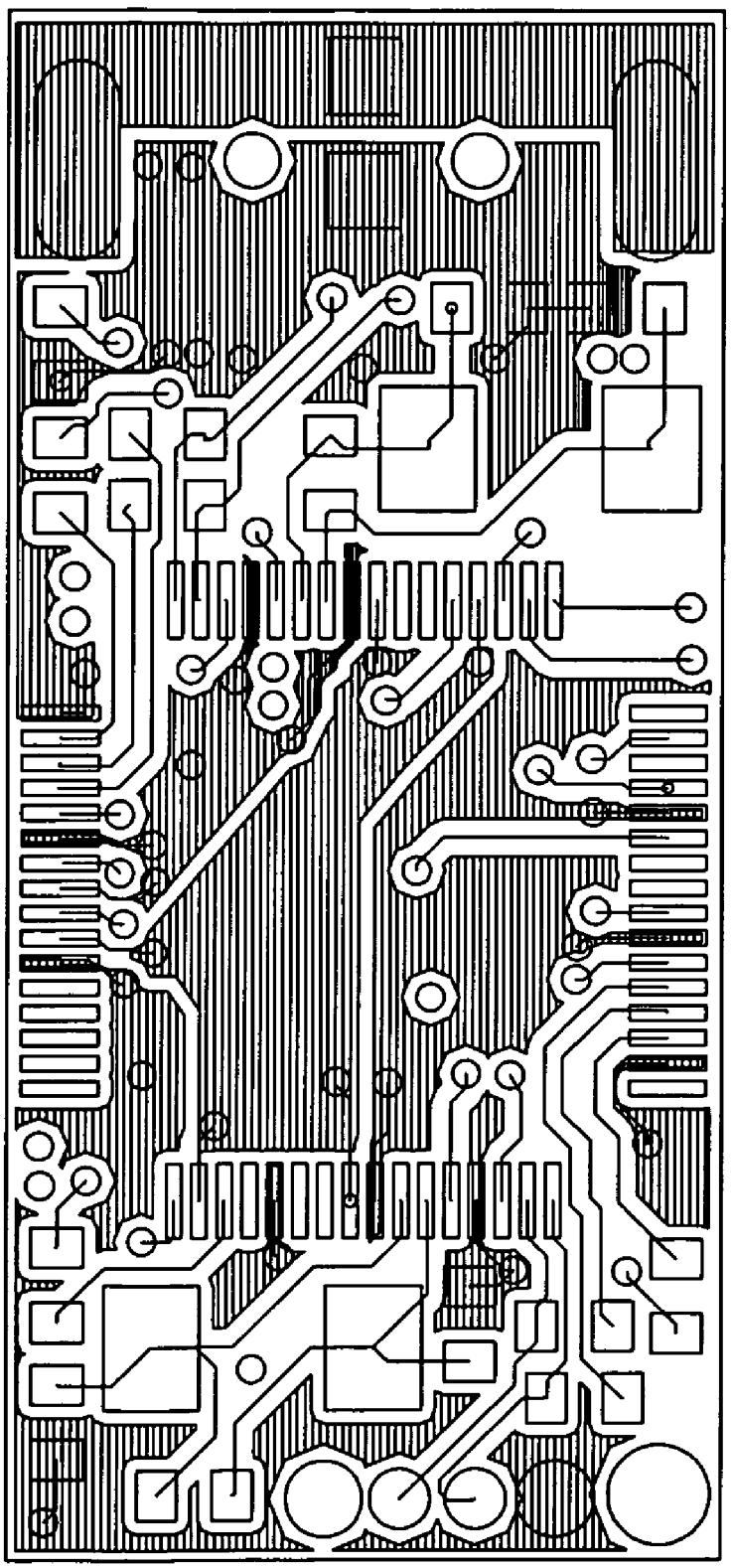
FIG. 5 is a circuit connection diagram of the electronic elements of FIG. 4.
Figure 6:
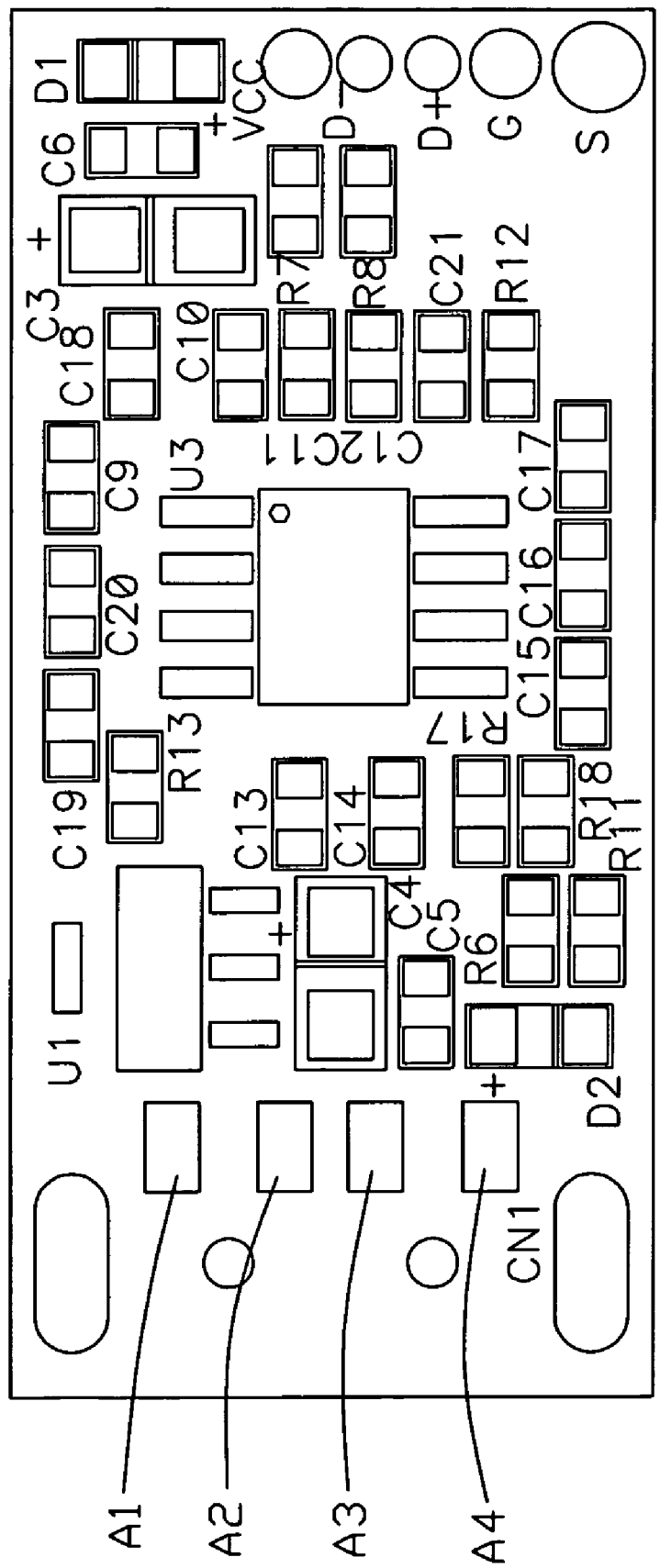
FIG. 6 is a sketch view of electronic elements disposed on a lower surface of the PCB of the USB migration control block.
Figure 7:
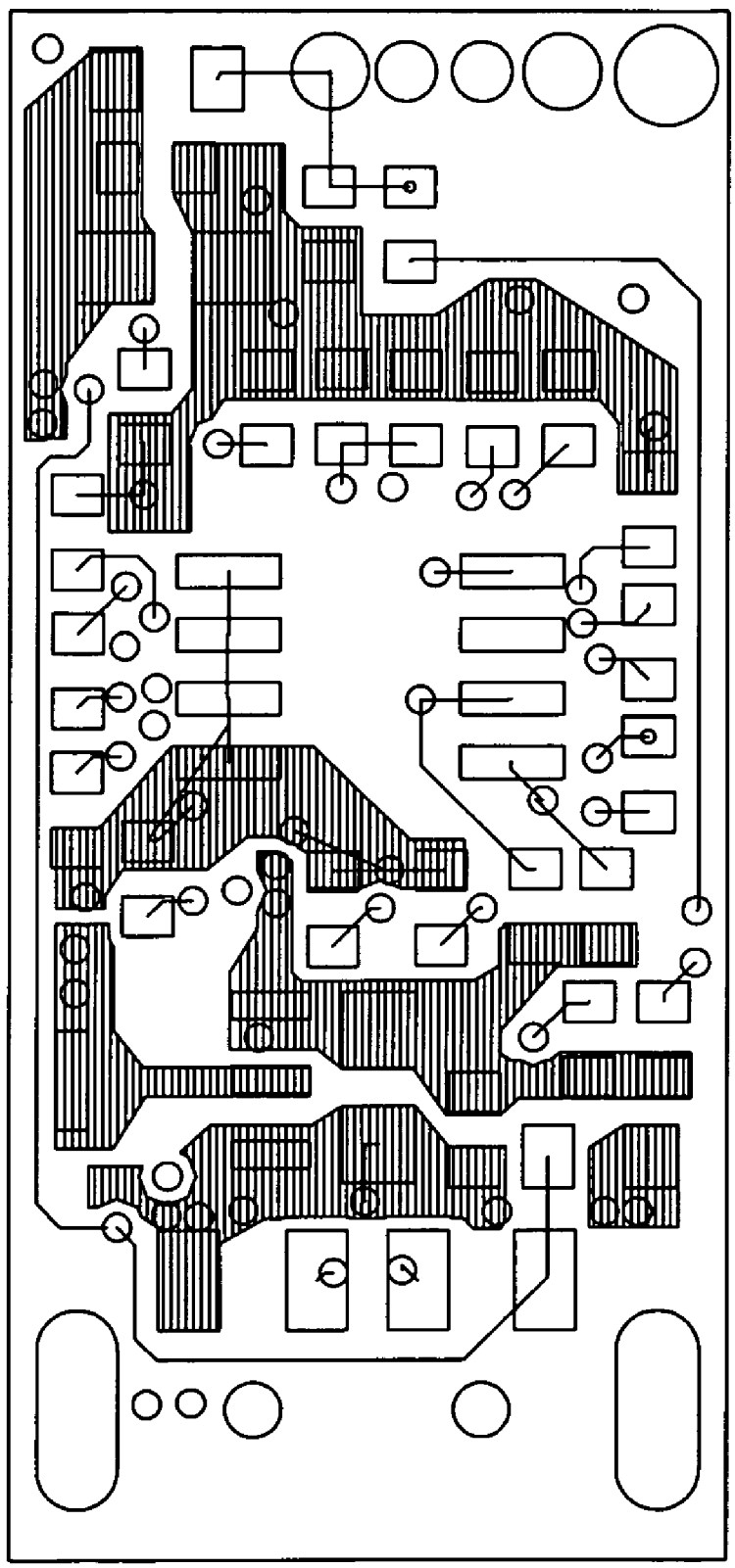
FIG. 7 is a circuit connection diagram of the electronic elements of FIG. 6.

Referring to FIGS. 4 and 5, which illustrate electronic elements arranged on the upper surface of the PCB 21 and circuit diagrams of the electronic elements. A USB migration control chipset U2 occupies a middle area of the PCB, for controlling data transmission between two computers (not shown) via USB ports. A type of product PL-25A1 manufactured by Prolific Technology Inc. may be used for the USB migration control chipset. When the first cable connector assembly 100 and the second cable connector assembly respectively interconnect with the USB ports of the two computers, the USB migration control chipset U2 receives data from the first computer, then sends them out to the second computer, or receives data from the second computer and sent them out to the first computer. Two oscillators Y1, Y2 are arranged at two opposite sections outside of the USB migration control chipset U2, and the oscillators Y1, Y2 provide 12 MHZ clock signals for the USB migration control chipset U2. Referring to FIGS. 6 and 7, which show a lower surface of the PCB 21 opposite to the upper surface, with some electronic elements mounted thereon and circuit diagrams between the electronics. An EEPROM U3 is disposed on the middle portion of the PCB 21, and the EEPROM U3 is used for storing some parameters settings which optimize the USB migration control chipset U2. A power source (not labeled) comprises a voltage regulator U1, two diodes D1, D2 serially interconnecting with the voltage regulator U1. The diodes D1, D2 are diagonally disposed on the PCB 21, while the voltage regulator U1 is mounted on a front section of the PCB 2. The power source supplies an input voltage of 3.3V standard for the USB migration control block 2.

Referring to FIGS. 1 and 6, a connection between the first USB connector 1, the USB migration control block 2 and the cable 5 is illustrated. The lower surface of the front end of the PCB 21 has four conductive traces A1, A2, A3 and A4 aligned in a row along a front-to-back direction, and other two conductive holes CN1 are respectively disposed outside of the conductive traces A1~A4. The conductive traces A1~A4 and conductive holes CN1 electrically connect the first USB connector 1. The conductive traces A1, A4 respectively soldered to the rear portions 122 of the terminals 12 adapted for transmitting negative and positive electricity, while the conductive traces A2, A3 respectively soldered to the rear portions 122 of the terminals 12 used for transmitting signals. The conductive holes CN1 receive tabs (not shown) formed on the protrusions 134 of the metal shell 13 with the tabs soldered therein via Through-hole Reflow (THR) technique. The lower surface of the rear end of the PCB 21 forms five conductive pads VCC, D–, D+, G and S aligned in a row along a front-to-back direction, and these conductive pads electrically connect with the cable 5. The conductive pads VCC, G are soldered to the wires 52 for transmitting positive electricity and negative electricity. While the conductive pads D–, D+ are soldered to the wires 51 for transmission data, and the conductive pad S is soldered to the metal braiding shield 53.

When assembly, firstly, all the electronic elements, such as resistors R1~R18, capacitors C1~C21, inductance L1, Diodes D1~D2, the USB migration control chipset U2 and EEPROM U3 are mounted on the upper surface and lower surface of the PCB 21 and soldered thereon to form the USB migration control unit 20. Secondly, the first USB connector 1 is soldered to the front end of the PCB 21 and the cable 5 is soldered to the rear end of the PCB 21. Thirdly, the insulated member 22 is over molded with the USB migration control unit 20, the rear end of the first USB connector 1 and the front end of the cable 5. Fourthly, the strain relief device 3 is molded over the rear end of the insulated member 22 and the cable 5 adjacent to the insulated member 22. Fifthly, the USB migration control unit 20 is put into the chamber 420 of the lower half part 42, with the front part of the first USB connector 1 forwardly extending out of the chamber 420 through the rectangular opening 426, the protruding member 32 of the strain relief device 3 rearward extending beyond the chamber 420 via the semi-circular hole 427. Sixthly, the upper half part 41 is assembled to the lower half part 42, with the positioning posts and retaining holes of the upper half part 41 engaging with the retaining holes 429 and positioning posts 428 of the lower half part 42. Seventhly, the upper half part 41 and the lower half part 42 are combined together by ultrasonic welding technique. The aforementioned cable connector assembly can be used for transmission data between two computers (not shown) which installed different operating systems, such as Windows XP and Windows Vista, or the same operating systems as Window Vista.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

What is claimed is:

1. A cable connector assembly adapted for interconnecting two computers and transmission data therebetween, comprising:
 a first cable connector assembly comprising:
 a universal serial bus (USB) migration control block having a printed circuit board (PCB) with a USB migration control chipset mounted thereon;
 a first universal serial bus connector comprising an insulated housing, a number of terminals received in the insulated housing and a metal shell shielding the insulated housing, said terminals including two terminals transmitting power and two additional terminals transmitting data, the two terminals soldered to two conductive traces formed on a first end of the printed circuit board to power the USB migration control block, the two additional terminals soldered to other two conductive traces formed the first end of the printed circuit board to transmitting data which is managed by the USB migration control chipset, a protrusion extending rearward from a lateral side of the metal shell and soldered to the first end of the printed circuit board;
 a cable with one end soldered to a second end of the printed circuit board; and
 a second cable connector assembly including a second universal serial bus connector electrically connecting with the other end of the cable.

2. The cable connector assembly as claimed in claim 1, further comprising a cover defining a receiving space accommodating the universal serial bus migration control block.

3. The cable connector assembly as claimed in claim 2, wherein the cover includes an upper half part and a lower half part to together define the receiving space.

4. The cable connector assembly as claimed in claim 3, wherein both the upper half part and the lower half part have a left wall and a right wall, and wherein the left wall of the upper half part defines two retaining holes and the left wall of the lower half part forms two corresponding positioning posts received in the retaining holes.

5. The cable connector assembly as claimed in claim 2, wherein the universal serial bus migration control block has an insulated member molded over a rear portion of the first universal serial bus connector, and wherein the cover encloses the insulated member therein.

6. The cable connector assembly as claimed in claim 5, further comprising a strain relief device disposed between the migration control block and the cable.

7. The cable connector assembly as claimed in claim 6, wherein the stain relief device comprises a base portion and a protruding portion extending rearward from the back of the base portion, and wherein the base portion is molded over the rear portion of the insulated member and the protruding member is molded over part of the cable adjacent to the insulated member.

8. The cable connector assembly as claimed in claim 7, wherein the base portion of the strain relief device is received in the receiving space of the cover, and wherein the protruding portion rearward extends out of the receiving space.

9. The cable connector assembly as claimed in claim 1, wherein the cable comprises a plurality of wires, a metal braiding shrouding the wires and an insulated jacket enclosing the metal braiding, and wherein the rear end of the printed circuit board forms a plurality of conductive pads electrically connecting with the wires and the metal braiding.

* * * * *